United States Patent
Xu et al.

(10) Patent No.: US 8,142,703 B2
(45) Date of Patent: Mar. 27, 2012

(54) IMPRINT LITHOGRAPHY METHOD

(75) Inventors: Frank Y. Xu, Round Rock, TX (US); Ian Matthew McMackin, Austin, TX (US); Pankaj B. Lad, DeSoto, TX (US)

(73) Assignee: Molecular Imprints, Inc., Austin, TX (US)

( * ) Notice: Subject to any disclaimer, the term of this patent is extended or adjusted under 35 U.S.C. 154(b) by 216 days.

(21) Appl. No.: 12/336,821

(22) Filed: Dec. 17, 2008

(65) Prior Publication Data

US 2009/0136654 A1   May 28, 2009

Related U.S. Application Data

(63) Continuation-in-part of application No. 11/244,428, filed on Oct. 5, 2005, now Pat. No. 7,837,921.

(60) Provisional application No. 61/014,574, filed on Dec. 18, 2007.

(51) Int. Cl.
  *B29C 41/12* (2006.01)
  *B28B 11/10* (2006.01)
(52) U.S. Cl. ........................ 264/293; 264/338
(58) Field of Classification Search .................. None
  See application file for complete search history.

(56) References Cited

U.S. PATENT DOCUMENTS

| | | |
|---|---|---|
| 3,403,122 A | 9/1968 | Sherman et al. |
| 3,787,351 A | 1/1974 | Olson |
| 3,810,874 A | 5/1974 | Mitsch et al. |
| 4,303,761 A | 12/1981 | Apotheker |
| 4,512,848 A | 4/1985 | Deckman et al. |
| 4,585,829 A | 4/1986 | Kuo et al. |
| 4,614,667 A | 9/1986 | Larson et al. |
| 4,617,238 A | 10/1986 | Crivello et al. |
| 4,731,155 A | 3/1988 | Napoli et al. |
| 4,803,145 A | 2/1989 | Suzuki et al. |
| 4,826,943 A | 5/1989 | Ito et al. |
| 4,835,084 A | 5/1989 | Nair et al. |
| 4,845,008 A | 7/1989 | Nishioka et al. |
| 4,931,351 A | 6/1990 | McColgin et al. |
| 5,028,366 A | 7/1991 | Harakal et al. |
| 5,169,494 A | 12/1992 | Hashimoto et al. |
| 5,298,556 A | 3/1994 | Stephens |
| 5,331,020 A | 7/1994 | Brown et al. |
| 5,369,722 A | 11/1994 | Heming et al. |
| 5,380,644 A | 1/1995 | Yonkoski et al. |
| 5,389,696 A | 2/1995 | Dempsey et al. |
| 5,397,669 A | 3/1995 | Rao |

(Continued)

FOREIGN PATENT DOCUMENTS

EP  1342736  9/2003

(Continued)

OTHER PUBLICATIONS

Johnson et al., Advances in Step and Flash Imprint Lithography, SPIE Microlithography Conference Feb. 23, 2003.

(Continued)

*Primary Examiner* — Edmund H. Lee
(74) *Attorney, Agent, or Firm* — Heather L. Flanagan; Fish & Richardson P.C.

(57) ABSTRACT

A template is treated to provide a surfactant rich region and a surfactant depleted region. A contact angle at the surfactant rich region may be greater than, less than, or substantially similar to a contact angle of the surfactant depleted region.

18 Claims, 7 Drawing Sheets

U.S. PATENT DOCUMENTS

| | | |
|---|---|---|
| 5,425,848 A | 6/1995 | Haisma et al. |
| 5,462,700 A | 10/1995 | Beeson et al. |
| 5,542,978 A | 8/1996 | Kindt-Larsen et al. |
| 5,569,691 A | 10/1996 | Guggenberger et al. |
| 5,594,042 A | 1/1997 | Glover et al. |
| 5,601,641 A | 2/1997 | Stephens |
| 5,629,095 A | 5/1997 | Bujanowski et al. |
| 5,629,128 A | 5/1997 | Shirakawa et al. |
| 5,631,314 A | 5/1997 | Wakiya et al. |
| 5,747,234 A | 5/1998 | Wexler et al. |
| 5,772,905 A | 6/1998 | Chou |
| 5,837,314 A | 11/1998 | Beaton et al. |
| 5,849,209 A | 12/1998 | Kindt-Larsen et al. |
| 5,849,222 A | 12/1998 | Jen et al. |
| 5,861,467 A | 1/1999 | Bujanowski et al. |
| 5,969,063 A | 10/1999 | Parker et al. |
| 6,054,034 A | 4/2000 | Soane et al. |
| 6,093,455 A | 7/2000 | Kamen et al. |
| 6,142,811 A | 11/2000 | Lin |
| 6,146,811 A | 11/2000 | Kim et al. |
| 6,169,139 B1 | 1/2001 | van Cleeff |
| 6,204,343 B1 | 3/2001 | Barucha et al. |
| 6,276,273 B1 | 8/2001 | Aurenty et al. |
| 6,309,580 B1 | 10/2001 | Chou |
| 6,334,960 B1 | 1/2002 | Willson et al. |
| 6,372,838 B1 | 4/2002 | Rao et al. |
| 6,375,870 B1 | 4/2002 | Visovsky et al. |
| 6,391,217 B2 | 5/2002 | Schaffer et al. |
| 6,447,919 B1 | 9/2002 | Brown et al. |
| 6,468,642 B1 | 10/2002 | Bray et al. |
| 6,475,704 B1 | 11/2002 | Iwasaki et al. |
| 6,482,742 B1 | 11/2002 | Chou |
| 6,503,914 B1 | 1/2003 | Benish et al. |
| 6,517,995 B1 | 2/2003 | Jacobson et al. |
| 6,518,189 B1 | 2/2003 | Chou |
| 6,544,594 B2 | 4/2003 | Linford et al. |
| 6,565,776 B1 | 5/2003 | Li et al. |
| 6,580,172 B2 | 6/2003 | Mancini et al. |
| 6,646,662 B1 | 11/2003 | Nebashi et al. |
| 6,649,272 B2 | 11/2003 | Moore et al. |
| 6,664,306 B2 | 12/2003 | Gaddam et al. |
| 6,664,354 B2 | 12/2003 | Savu et al. |
| 6,696,220 B2 | 2/2004 | Bailey et al. |
| 6,713,238 B1 | 3/2004 | Chou et al. |
| 6,719,915 B2 | 4/2004 | Willson et al. |
| 6,721,529 B2 | 4/2004 | Chen et al. |
| 6,737,489 B2 | 5/2004 | Linert et al. |
| 6,774,183 B1 | 8/2004 | Palumbo et al. |
| 6,776,094 B1 | 8/2004 | Whitesides et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,828,244 B2 | 12/2004 | Chou |
| 6,830,819 B2 | 12/2004 | Kaplan et al. |
| 6,873,087 B1 | 3/2005 | Choi et al. |
| 6,932,934 B2 | 8/2005 | Choi et al. |
| 6,936,194 B2 | 8/2005 | Watts |
| 6,957,608 B1 | 10/2005 | Hubert |
| 7,037,574 B2 | 5/2006 | Paranjpe et al. |
| 7,157,036 B2 | 1/2007 | Choi et al. |
| 7,307,118 B2 | 12/2007 | Xu et al. |
| 7,309,225 B2 | 12/2007 | McMackin et al. |
| 7,365,103 B2 | 4/2008 | Willson et al. |
| 7,837,921 B2 | 11/2010 | Xu et al. |
| 2001/0044075 A1 | 11/2001 | Nishimura et al. |
| 2001/0055727 A1 | 12/2001 | Kubota et al. |
| 2002/0042027 A1 | 4/2002 | Chou et al. |
| 2002/0072009 A1 | 6/2002 | Kim et al. |
| 2002/0084553 A1 | 7/2002 | Nun et al. |
| 2002/0115002 A1 | 8/2002 | Bailey et al. |
| 2002/0126189 A1 | 9/2002 | Gloster |
| 2002/0132482 A1 | 9/2002 | Chou |
| 2002/0135099 A1 | 9/2002 | Robinson et al. |
| 2002/0146642 A1 | 10/2002 | Kim et al. |
| 2002/0167117 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0166814 A1 | 9/2003 | Sparrowe et al. |
| 2003/0235787 A1 | 12/2003 | Watts et al. |
| 2004/0036201 A1 | 2/2004 | Chou et al. |
| 2004/0046271 A1 | 3/2004 | Watts |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0110856 A1 | 6/2004 | Young et al. |
| 2004/0116548 A1 | 6/2004 | Willson et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0168613 A1 | 9/2004 | Nguyen et al. |
| 2004/0170770 A1 | 9/2004 | Nguyen et al. |
| 2004/0188381 A1 | 9/2004 | Sreenivasan |
| 2004/0192041 A1 | 9/2004 | Jeong et al. |
| 2004/0197843 A1 | 10/2004 | Chou et al. |
| 2004/0211754 A1 | 10/2004 | Sreenivasan |
| 2004/0256764 A1* | 12/2004 | Choi et al. .................. 264/293 |
| 2005/0098534 A1 | 5/2005 | Sreenivasan et al. |
| 2005/0160934 A1 | 7/2005 | Xu et al. |
| 2005/0187339 A1 | 8/2005 | Xu et al. |
| 2005/0192421 A1 | 9/2005 | Xu et al. |
| 2005/0236739 A1 | 10/2005 | Willson et al. |
| 2006/0035029 A1 | 2/2006 | Xu et al. |
| 2006/0036051 A1 | 2/2006 | Xu et al. |
| 2006/0062867 A1 | 3/2006 | Choi et al. |
| 2006/0062922 A1 | 3/2006 | Xu et al. |
| 2006/0076717 A1 | 4/2006 | Sreenivasan et al. |
| 2006/0077374 A1 | 4/2006 | Sreenivasan et al. |
| 2006/0081557 A1 | 4/2006 | Xu et al. |
| 2006/0108710 A1 | 5/2006 | Xu et al. |
| 2006/0145398 A1 | 7/2006 | Bailey et al. |
| 2006/0279024 A1 | 12/2006 | Choi et al. |
| 2007/0017631 A1 | 1/2007 | Xu |
| 2007/0021520 A1 | 1/2007 | Xu |
| 2007/0141271 A1 | 6/2007 | Xu et al. |
| 2007/0212494 A1 | 9/2007 | Xu et al. |
| 2007/0272825 A1 | 11/2007 | Xu et al. |
| 2008/0000373 A1 | 1/2008 | Fetrucci et al. |
| 2008/0110557 A1 | 5/2008 | Xu |
| 2009/0136654 A1 | 5/2009 | Xu et al. |
| 2009/0272875 A1 | 11/2009 | Xu et al. |
| 2010/0109195 A1 | 5/2010 | Xu et al. |

FOREIGN PATENT DOCUMENTS

| | | |
|---|---|---|
| EP | 1491356 A2 | 12/2004 |
| EP | 20050722972 | 2/2005 |
| JP | 02-24848 | 1/1990 |
| JP | 02-92603 | 4/1990 |
| WO | WO 99/05724 | 2/1999 |
| WO | WO 00/21689 | 4/2000 |
| WO | WO0046035 A9 | 8/2000 |
| WO | WO0054107 A9 | 9/2000 |
| WO | WO 01/47003 | 6/2001 |
| WO | WO02069040 A1 | 9/2002 |
| WO | WO03073164 A2 | 9/2003 |
| WO | WO2004061526 A1 | 7/2004 |
| WO | WO2005000552 A3 | 1/2005 |
| WO | WO2005072120 A2 | 8/2005 |
| WO | WO2005082992 A1 | 9/2005 |
| WO | WO2007133235 | 11/2007 |

OTHER PUBLICATIONS

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.
Chou et al., Imprint of Sub-25 nm Vias and Trenches in Polymers, Appl. Phys. Lett. 67 (21) Nov. 20, 1995.
Bender et al., Multiple Imprinting in UV-based Nanoimprint Lithography: Related Material Issues, Microelectronic Engineering 61-62, pp. 407-413 Jan. 1, 2002.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Translation of Japanese Patent 02-92603, Apr. 3, 1990.
Translation of Japanese Patent 02-24848, Jan. 26, 1990.
Hirai et al., Mold Surface Treatment for Imprint Lithography, Journal of Photopolymer Science and Technology, vol. 14, No. 3, pp. 457-462 Aug. 1, 2001.
Roos et al., Nanoimprint Lithography with a Commercial 4 Inch Bond System for Hot embossing, Proceedings of SPIE vol. 4343, pp. 427-435 Oct. 1, 2001.
Chou et al., Ultrafast and Direct Imprint of Nanostructures in Silicon, Nature, Col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol b. 19(6) Nov. 1, 2001.
Yu et al., Properties of Fluorinated Amorphous Diamond Like Carbon Films by PECVD, Applied Surface Science 219 (3-4); pp. 228-237 Dec. 1, 2003.
Compon et al., Electroanalysis at Diamond-Like and Doped-Diamond Electrodes, Electroanalysis 15(17); pp. 1349-1363 Sep. 1, 2003.
Mansano et al., Protective Carbon Layer for Chemical Corrosion of Stainless Steel, Diamond and Related Materials 12 (3-7); pp. 749-752 Mar. 1, 2003.
Butter et al., Production and Wetting Properties of Fluorinated Diamond-Like Carbon Coatings, Thin Solid Films, 311(1-2); pp. 107-113 Dec. 31, 1997.
Hakovirta et al., Heat Resistance of Fluorinated Diamond-Like Carbon Films, Diamond and Related Materiasl 10(8); pp. 1486-1490 Aug. 1, 2001.
Zhu et al., The Improvement of the Oxidation Resistance of TiAl Alloys by Fluorine Plasma-Based Ion Implantation, Surface and Coatings Technology 158; pp. 502-507 Sep. 1, 2002.
Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178 Apr. 17, 2004.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Colburn, Dissertation for the Degree of Doctor of Philosophy, Step and Flash Imprint Lithography: A Low-Pressure, Room-Temperature Nanoimprint Lithography Aug. 1, 2001.
DuPont Zonyl Fluorochemical Intermediates, www.dupont.com/zonyl/pdf/intermediates.pdf; pp. 1-16 Jun. 21, 2003.
DuPont Zonyl UR, www.dupont.com/zonyl/pdf/UR.pdf; pp. 1-2 Jun. 21, 2003.
DuPont Zonyl FSN, www.dupont.com/zonyl/odf/FSN.pdf; pp. 1-2 Aug. 24, 2003.
Masurf FS-230, www.masonsurfactants.com/Products/Masurf_FS_230.htm; pp. 1-2 Apr. 5, 2004.
FC-4432 Produce Brochure, 3M Fluorosurfactant Mar. 1, 2002.
Bender et al., Multiple imprinting in UV-based nanoimprint lithography: related material issues, Microelectronic Engineering 53 (2000), pp. 233-236.
Bongiovanni et al., "High resolution XPS investigation of photocured films containing perfluoropolyether acrylates", Polymer, Elsevier Science Publishers B.V, GB, vol. 41, No. 2, Jan. 1, 2000, pp. 409-414.
Fukuhara et al., UV Nanoimprint Lithography and Its Application for Nanodevices, Journal of Photopolymer Science and Technology 20:4 (2007) pp. 549-554.
Guo et al., Nanoimprint Lithogrpahy: Methods and Material Requirements, Advanced Materials 19 (2007) pp. 495-513.
Jung et al., Orientation-Controlled Self-Assembled Nanolithography Using a Polystyrene-Polydimethylsiloxane Block Copolymer, Nano Letters, vol. 7, No. 7, pp. 2046-2050 (2007) Apr. 19, 2007.
Kim et al., Fabrication of Trilayer Resist Using Photocuring-Imprint Lithography, Journal of Vacuum Science and Technology B 21:6 (2003) pp. 3144-3148.
Komuro et al., Improvement of Imprinted Pattern Uniformity Using Sapphire Mold, Japanese Journal Applied Physics 41 (2002) 4182-4185.
Lin et al., Role of surfactants in adhesion reduction for step and flash imprint lithography, J. Micro/Nanolith., MEMS MOEMS 7(3) Jul.-Sep. 2008, 8 pages.
3M Novec Fluorosurfactant FC-4432, Product Information, www.3m.com/paintsandcoatings, Oct. 2003, 4 pages (MII 05-353).
Scheerlinck et al., Nano Imprint Lithography for Photonic Structure Patterning, Proceedings Symposium IEEE/LEOS. Benelux Chapter, 2005, Mons, pp. 63-66.
Taniguchi et al., Measurement of Adhesive Force Between Mold and Photocurable Resin in Imprint Technology, Japanese Journal of Applied Physics 41(2002) 4194-4197.
Voisin et al., Characterization of Ultraviolet Nanoimprint Dedicated Resists, Microelectronic Engineering 84 (2007) 967-972.
Xu et al., Development of Imprint Materials for the Step and Flash Imprint Lithography Process, SPIE Microlithography Conference, Feb. 2004, 10 pages.
Zhaohui, et al., "Surface activity of perfluorodecanoyl end-capped poly(ethylene oxide) and associated adsorption behavior to the air-water interface", Polymer, Elsevier Science Publishers B.V, GB, vol. 39, No. 19, Sep. 1, 1998, pp. 4655-4664.
International Search Report for Application No. PCT/US2004/18857, dated Apr. 26, 2005, 2 pages.
International Search Report for Application No. PCT/US2005/001054, dated Aug. 29, 2005, 1 page.
International Search Report for Application No. PCT/US05/04415, dated Jun. 15, 2005, 1 page.
International Search Report for Application No. PCT/US2009/005990, dated Sep. 15, 2010, 11 pages.
European Search Report for Application No. EP10181754, dated Oct. 26, 2010, 6 pages.
European Search Report for Application No. EP05820878, dated Oct. 28, 2010, 7 pages.
International Search Report for Application No. PCT/US2008/013827, dated Apr. 7, 2009, 1 page.
Written Opinion for Application No. PCT/US2008/013827, dated Apr. 7, 2009, 4 pages.

* cited by examiner

EVAPORATION

EVAPORATION

IMPRINT LITHOGRAPHY METHOD

CROSS REFERENCE TO RELATED APPLICATION

This application is a continuation-in-part of U.S. patent application Ser. No. 11/244,428, filed on Oct. 5, 2005 now U.S. Pat. No. 7,837,921. This application also claims priority to U.S. Provisional Patent Application Ser. No. 61/014,574 filed on Dec. 18, 2007 now abandoned, which is hereby incorporated by reference herein.

STATEMENT REGARDING FEDERALLY SPONSORED RESEARCH OR DEVELOPMENT

The United States government has a paid-up license in this invention and the right in limited circumstance to require the patent owner to license other on reasonable terms as provided by the terms of 70NANB4H3012 awarded by National Institute of Standards (NIST) ATP Award.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
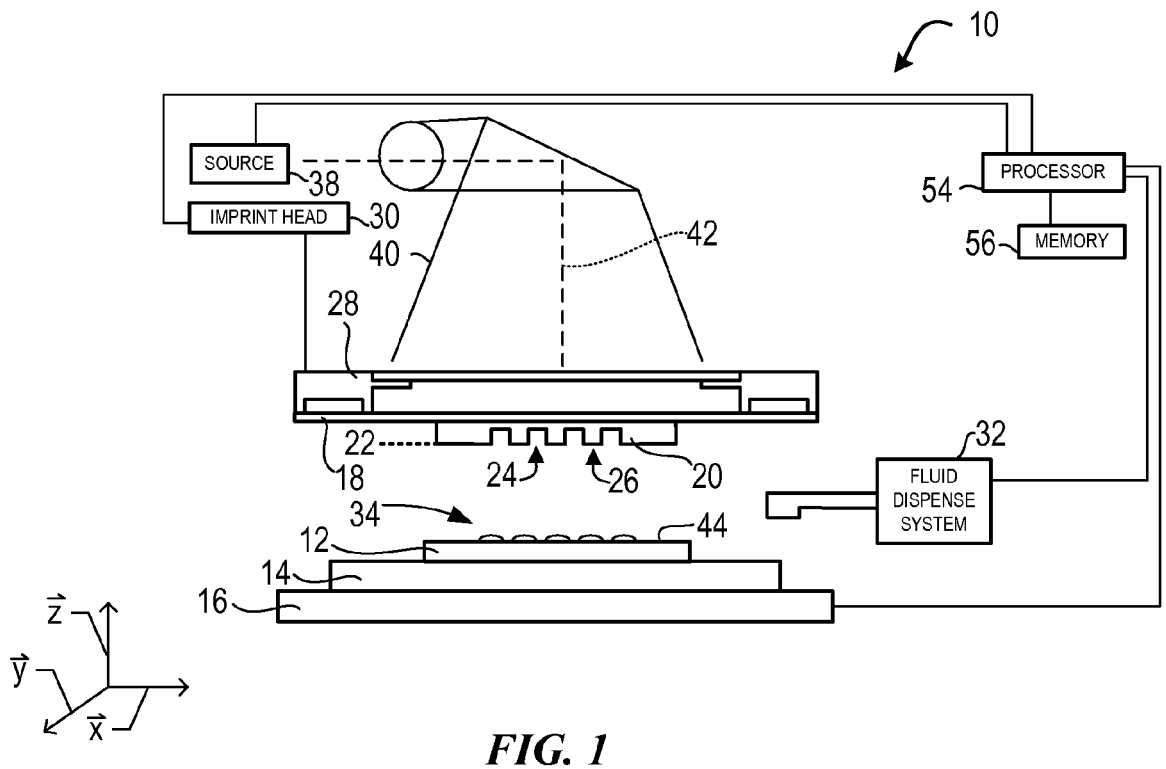
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
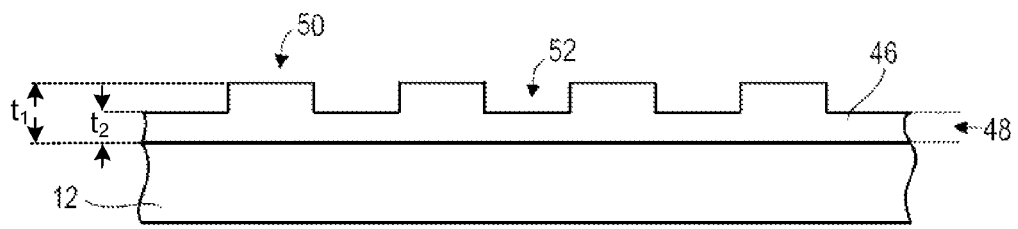
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or crosslink conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference herein.

In another embodiment, the above-mentioned system and process may be employed using techniques including, but not limited to, photolithography (e.g., various wavelengths including G line, I line, 248 nm, 193 nm, 157 nm and 13.2-13.4 nm), contact lithography, e-beam lithography, x-ray lithography, ion-beam lithography, atomic lithography, and the like.

Currently, within the art, treatment of template 18 with surfactant molecules is provided as a diluted spray-on surfactant/solvent solution. In using the diluted spray-on surfactant/solvent solution, it is generally difficult to obtain precise distribution of the surfactant molecules on the templates.

Figure 3A:
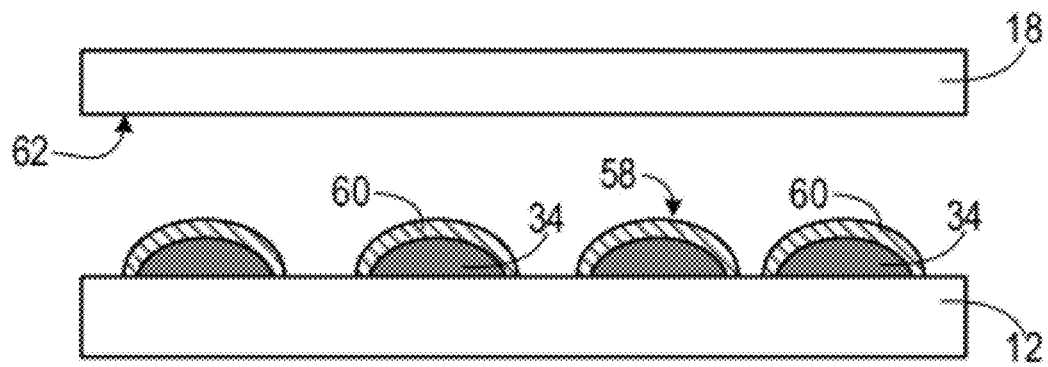
FIGS. 3A-3C illustrate simplified side views of a template being treated with imprint fluid containing polymerizable material and surfactant liquid.
Figure 3B:
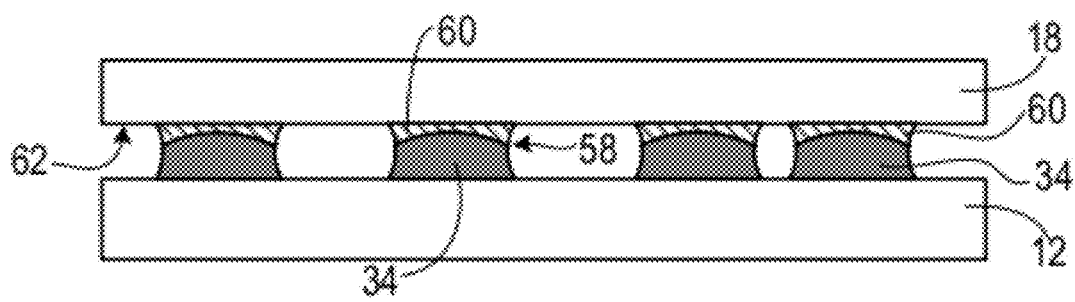
Figure 3C:
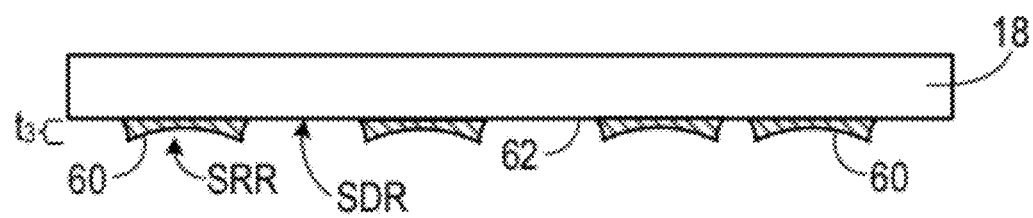

FIGS. 3A-3C illustrate simplified side views of an exemplary embodiment for providing precise distribution of a surfactant on template 18 to provide two regions: a surfactant rich region SRR and a surfactant depleted region SDR. Generally, treatment of template 18, by contacting template 18 with surfactant (e.g., surfactant liquid 60) deposited on substrate 12, may provide control over distribution of surfactant liquid 60 to provide surfactant rich region SRR and surfactant depleted region SDR. Control of the distribution may further allow for control over the magnitude of the contact angle $\theta_{SRR}$ within the surfactant rich region SRR and the magnitude of the contact angle $\theta_{SDR}$ within the surfactant depleted region SDR. As such, the contact angle $\theta_{SRR}$ within the surfactant rich region SRR and the contact angle $\theta_{SDR}$ within the surfactant depleted region SDR may target different applications providing for $\theta_{SRR}>\theta_{SDR}$; $\theta_{SRR}<\theta_{SDR}$; and/or $\theta_{SRR}\approx\theta_{SRR}\approx\theta_{SDR}$. Additionally, by varying the composition of surfactant liquid 60, contact angles $\theta_{SRR}$ and/or $\theta_{SDR}$ may be controlled to target different applications providing for $\theta_{SRR}>\theta_{SDR}$; $\theta_{SRR}<\theta_{SDR}$; and/or $\theta_{SRR}\approx\theta_{SDR}$.

Referring to FIG. 3A, surface 62 of template 18 initially may be substantially free of surfactant liquid 60. Alternatively, surface 62 of template 18 may be pre-treated. For example, surface 62 of template 18 may be pre-treated with the diluted spray-on surfactant/solvent solution described above.

To provide surfactant liquid 60 to template 18, imprint fluid 58 may be deposited on substrate 12. Imprint fluid 58 may include, but is not limited to, polymerizable material 34 and surfactant liquid 60. Polymerizable material 34 may be formed from several different families of bulk materials. For example, polymerizable material 34 may be fabricated from bulk materials including, but not limited to, vinyl ethers, methacrylates, epoxies, thiol-enes and acrylates, and/or the like. Bulk materials are described in further detail in U.S. Pat. No. 7,307,118, which is hereby incorporated by reference herein.

Once imprint fluid 58 is deposited on substrate 12, generally the surfactant liquid 60 may migrate to the gas/liquid interface. As such, by positioning template 18 in contact with imprint fluid 58 as shown in FIG. 3B, at least a portion of surface 62 of template 18 may be treated with surfactant liquid 60.

Generally, after treatment with surfactant liquid 60, surface 62 of template 18 may be defined by the surfactant rich region SRR and/or the surfactant depleted region SDR as illustrated in FIG. 3C. The surfactant rich region SRR may include a layer of surfactant liquid 60 having a thickness $t_3$. For example, the layer of surfactant liquid 60 may have a thickness $t_3$ of approximately 0.2 to 5 nm. The surfactant depleted region SDR may include a layer of surfactant liquid 60 having a thickness $t_4$. Generally, the thickness $t_4$ of the surfactant depleted region SDR may be substantially reduced as compared to the thickness $t_3$ of the surfactant rich region SRR. For example, the thickness $t_4$ of the surfactant depleted region may be zero or near zero.

Distribution of surfactant liquid 60 on template 18 may provide the contact angle $\theta_{SRR}$ at the surfactant rich region SRR and the contact angle $\theta_{SDR}$ at the surfactant depleted region SDR to be $\theta_{SRR}>\theta_{SDR}$; $\theta_{SRR}<\theta_{SDR}$; and/or $\theta_{SRR}\approx\theta_{SDR}$. Generally, the contact angle $\theta_{SRR}$ at the surfactant rich region SRR and the contact angle $\theta_{SDR}$ at the surfactant depleted region SDR may be less than approximately 55°.

Further, the composition of surfactant liquid 60 may provide for different contact angles; surfactant liquid 60 may be selected to provide an approximate contact angle $\theta_{SRR}$ at the surfactant rich regions SRR and an approximate contact angle $\theta_{SDR}$ at the surfactant depleted regions SDR. As such, selection of surfactant liquid 60 may provide $\theta_{SRR}>\theta_{SDR}$, $\theta_{SRR}<\theta_{SDR}$, and/or $\theta_{SRR}\approx\theta_{SDR}$, depending on the design considerations of an application.

Exemplary surfactant (e.g., surfactant liquids 60) may include surfactant components such as fluoro-aliphatic polymeric esters, fluorosurfactants of polyoxyethylene, fluorosurfactants of polyalkyl ether, fluoroalkyl polyethers, and/or the like. Exemplary surfactant components are further described in U.S. Pat. No. 3,403,122, U.S. Pat. No. 3,787,351, U.S. Pat. No. 4,803,145, U.S. Pat. No. 4,835,084, U.S. Pat. No. 4,845,008, U.S. Pat. No. 5,380,644, U.S. Pat. No. 5,747,234, U.S. Pat. No. 6,664,354, and U.S. Patent Publication No. 2006/0175736, all of which are hereby incorporated by reference herein.

Exemplary commercially available surfactant components include, but are not limited to, ZONYL® FSO, ZONYL® FSO-100, ZONYL® FSN-100, and ZONYL® FS-300, manufactured by E.I. du Pont de Nemours and Company having an office located in Wilmington, Del.; FC-4432, FC-4430, and FC-430, manufactured by 3M having an office located in Maplewood, Minn.; MASURF® FS425, MASURF® FS1700, MASURF® FS2000, MASURF® FS1239, manufactured by Mason Chemical Company having an office located in Arlington Heights, Ill.; Lodyne S-107B, Lodyne S-220N, manufactured by Ciba-Geigy Corporation having an office located in Basel, Switzerland; Unidyne NS1602, Unidyne NS1603, Unidyne NS1606a, manufactured by Daikin having an office located in Kita-ku, Osaka, Japan; MegaFace R-08 manufactured by Dainippon Ink & Chemical having an office located in Nihonbaski, Chuo, Japan.

Selection of surfactant (e.g., surfactant liquid 60) may be provided through contact angle analysis. Contact angle analysis may include simulated testing of the contact angles on simulated surfactant rich regions $SRR_{SIM}$ and/or simulated surfactant depleted regions $SDR_{SIM}$.

Figure 4A:
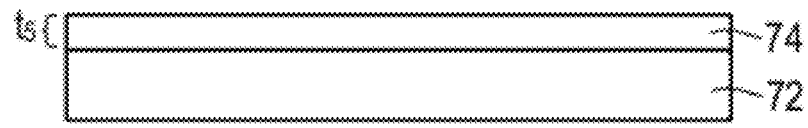
FIGS. 4A-4C illustrate simplified side views of a testing substrate having surfactant solution and imprint fluid deposited thereon.
Figure 4B:
Figure 4B:
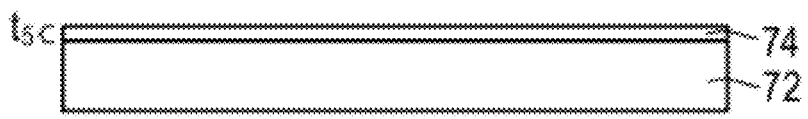
Figure 4C:
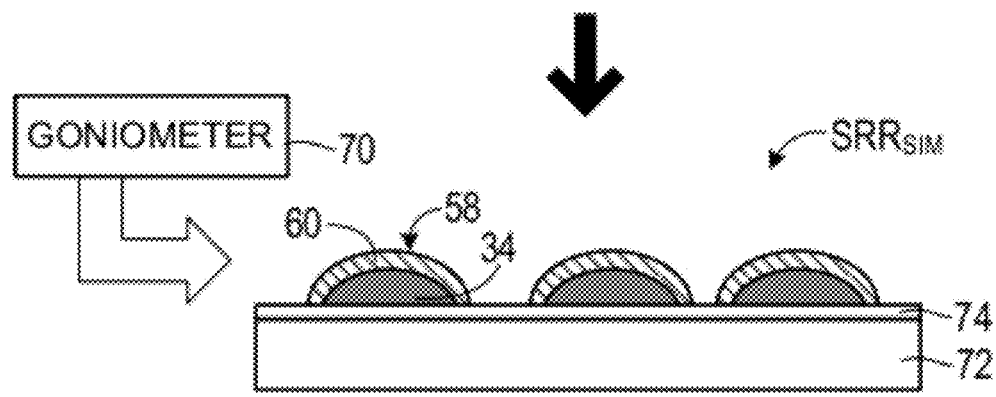

Referring to FIGS. 4A-4C, contact angle analysis on simulated surfactant rich regions $SRR_{SIM}$ may be provided by contact angle measurement by goniometer 70 on testing substrate 72. Testing substrate 72 may be formed of material that is substantially similar to template 18. For example, testing substrate 72 may be formed of fused silica. Additionally, testing substrate 72 may be sized such that it is substantially similar to template 18 and/or sized to accommodate at least one simulated surfactant rich region $SRR_{SIM}$.

Testing substrate 72 may be cleaned, baked dry, and stored in a nitrogen box. As illustrated in FIG. 4A, testing substrate 72 may be rinsed with a surfactant solution to provide film 74 having a thickness $t_5$. The surfactant solution may be a diluted surfactant solution. For example, the surfactant solution may be a solution formed of a percentage of weight of surfactant molecules in Isopropyl Alcohol (IPA). Surfactant molecules within the surfactant solution may be similar to surfactant molecules within surfactant liquid 60. Film 74 of the surfactant solution on testing substrate 72 may be dried, and/or a substantial portion of film 74 may evaporate, reducing thickness $t_5$ as illustrated in FIG. 4B. For example, after evaporation, thickness $t_5$ may be substantially zero as IPA within the surfactant solution may be substantially evaporated.

Referring to FIG. 4C, drops of imprint fluid 58 may be deposited on testing substrate 72 to form the simulated surfactant rich region $SRR_{SIM}$. Each drop of imprint fluid 58 may have a volume $V_D$. For example, the volume $V_D$ of each drop may be approximately 5 µL. The volume $V_D$ may include polymerizable material 34 and surfactant liquid 60. Surfactant liquid 60 may be comprised of similar surfactant molecules as compared to surfactant solution 74. Alternatively, surfactant liquid 60 may be comprised of different surfactant molecules as compared to surfactant solution 74.

The contact angle of imprint fluid 58 on testing substrate 72 may be measured at multiple locations on testing substrate 72. For example, the contact angle of imprint fluid 58 may be measured at several locations (e.g., seven locations) using goniometer 70. The contact angles at multiple locations may be averaged to provide the magnitude of the contact angle $\theta_{R-SIM}$ on the simulated surfactant rich regions $SRR_{SIM}$.

Figure 5A:
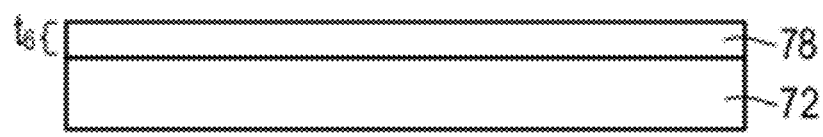
FIGS. 5A-5C illustrate simplified side views of a testing substrate having solvent and imprint fluid deposited thereon.
Figure 5B:
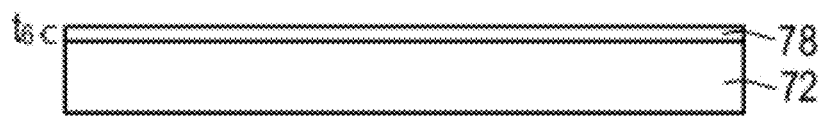
Figure 5C:
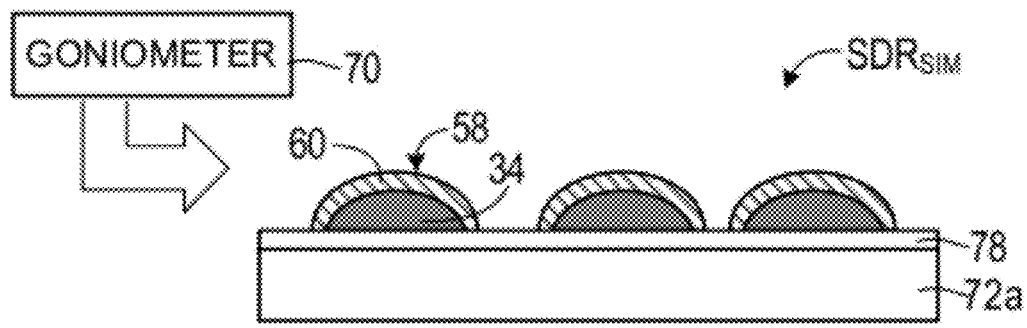

Referring to FIGS. 5A-5C, contact angle analysis on simulated surfactant depleted regions $SDR_{SIM}$ may be provided contact angle measurements of goniometer 70 on testing substrate 72a. Testing substrate 72a may be formed of material that is substantially similar to template 18 and/or material that is substantially similar to testing substrate 72. For example, testing substrate 72a may be formed of fused silica. Additionally, testing substrate 72a may be sized such that it is substantially similar to template 18 and/or sized to accommodate at least one simulated surfactant depleted region $SDR_{SIM}$.

Similar to testing substrate 72 in FIG. 4, testing substrate 72a in FIG. 5A may be cleaned, baked dry, and stored in a nitrogen box. Testing substrate 72a may then be rinsed with a solvent (e.g., IPA) to provide film 78 having a thickness $t_6$. Film 78 of solvent on testing substrate 72a may be dried and/or at least a portion of film 78 of solvent may evaporate reducing thickness $t_6$ as illustrated in FIG. 5B. For example, thickness $t_6$ may be substantially zero after evaporation of a substantial portion of IPA.

Referring to FIG. 5C, drops of imprint fluid 58 may be deposited on testing substrate 72a to form the simulated surfactant depleted region $SDR_{SIM}$. Each drop of imprint fluid 58 may have a volume $V_{D2}$. For example, the volume $V_{D2}$ of each drop may be approximately 5 µL. The volume $V_{D2}$ may be substantially similar to the volume $V_D$ of drops on testing substrate 72 in FIG. 4. The volume $V_{D2}$ of drops on testing substrate 72a in FIG. 5C may include polymerizable material 34 and surfactant liquid 60.

The contact angle of imprint fluid 58 on testing substrate 72a may be measured at multiple locations on testing substrate 72a. For example, the contact angle of imprint fluid 58 may be measured at several locations (e.g., seven locations) by goniometer 70. The contact angles at multiple locations may be averaged to provide the magnitude of the contact angle $\theta_{D-SIM}$ on the simulated surfactant depleted regions $SDR_{SIM}$.

Variations of surfactant liquid 60 within imprint fluid 58 deposited on testing substrate 72a may provide control over the contact angles within the simulated surfactant rich regions $SRR_{SIM}$ and/or the simulated surfactant depleted regions $SDR_{SIM}$ leading to control over the surfactant rich regions SRR and the surfactant depleted regions SDR during imprinting. For example, imprint fluid 58 formed of surfactant liquid 60 having approximately 0.17% FC4432 and 0.33% FC4430 and polymerizable material 34 may provide for $\theta_{R-SIM}$ of approximately 20° and $\theta_{D-SIM}$ of approximately 22° such that $\theta_{R-SIM} \approx \theta_{D-SIM}$. In another example, imprint fluid 58 formed of surfactant liquid 60 having approximately 0.5% R-08 and polymerizable material 34 may provide for $\theta_{R-SIM}$ of approximately 15° and $\theta_{D-SIM}$ of approximately 22° such that $\theta_{R-SIM} < \theta_{D-SIM}$. In another example, imprint fluid 58 formed of surfactant liquid 60 having approximately 0.5% FS2000 and polymerizable material 34 may provide for $\theta_{R-SIM}$ of approximately 18° and $\theta_{D-SIM}$ of approximately 10° such that $\theta_{R-SIM} > \theta_{D-SIM}$.

Controlling Contact Angle to Provide Suitable Wetting Characteristics

Figure 6:
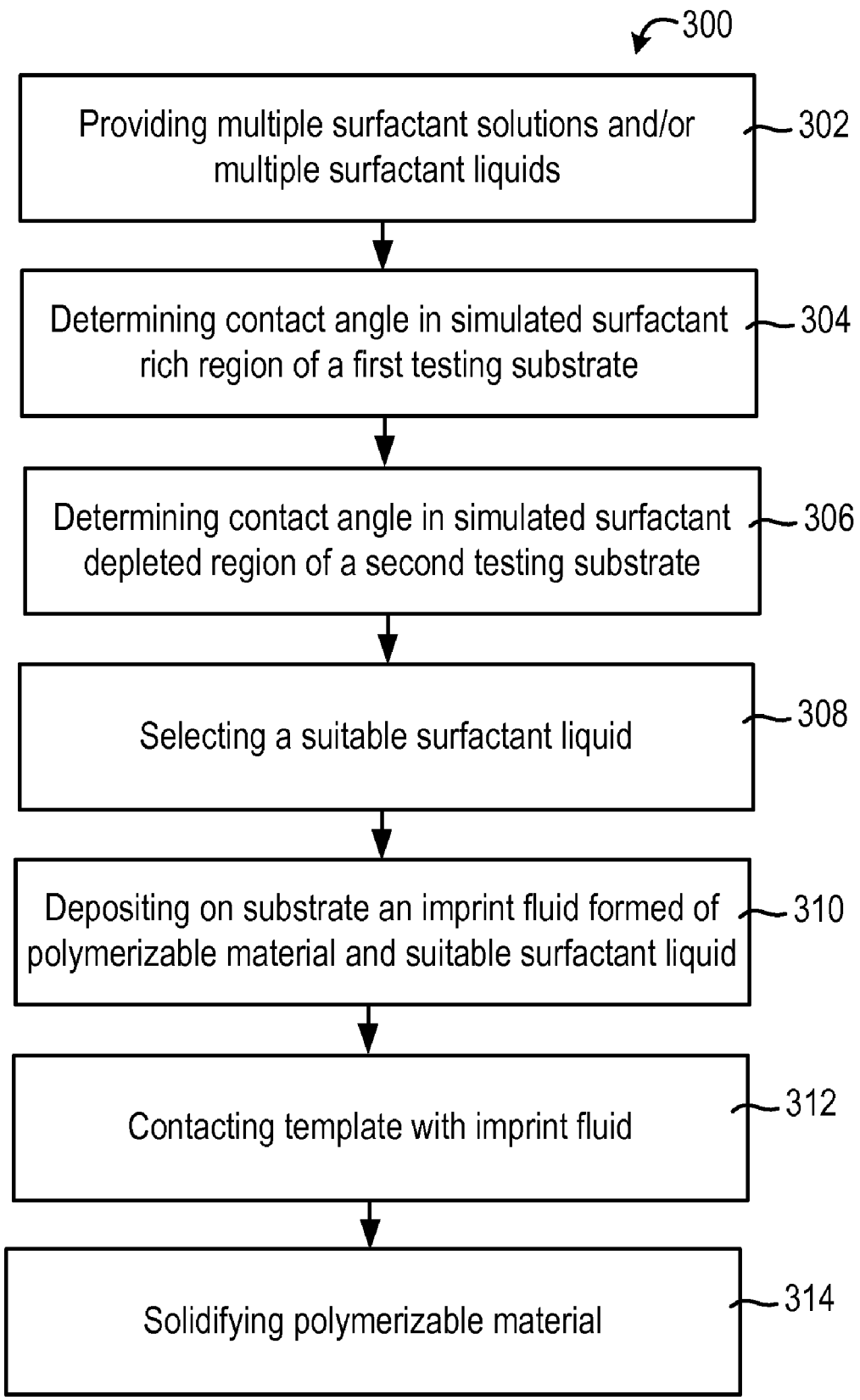
FIG. 6 illustrates a flow chart of an exemplary method for providing suitable wetting characteristics between a template and a polymerizable material.

FIG. 6 illustrates a flow chart of exemplary method 300 for providing suitable wetting characteristics between template 18 and polymerizable material 34. Suitable wetting characteristics may be created by controlling the contact angles $\theta_{SRR}$ and $\theta_{SDR}$. For example, by using results obtained from the contact angle analysis of the simulated surfactant rich region $SRR_{SIM}$ and the simulated surfactant depleted region $SDR_{SIM}$, surfactant liquid 60 providing approximate the contact angles $\theta_{R-SIM}$ and $\theta_{D-SIM}$ may be selected such that $\theta_{SRR} > \theta_{SDR}$. Application of surfactant liquid 60 on template 18 may then be controlled to provide the surfactant rich region SRR and the surfactant depleted region SDR on template 18. The reduced contact angle $\theta_{SDR}$ in the surfactant depleted region SDR on template 18, as compared to the contact angle $\theta_{SRR}$ in the surfactant rich region SRR, may provide polymerizable material 34 an additional driving force to wet the surfactant depleted region SDR. As such, voids formed within patterned layer 46 (shown in FIG. 2) may be significantly reduced during imprinting.

In a step 302, multiple surfactant solutions 74 and/or multiple surfactant liquids 60 may be provided. In a step 304, the contact angle $\theta_{R\text{-}SIM}$ in the simulated surfactant rich regions $SRR_{SIM}$ on testing substrate 72 rinsed with surfactant solution 74 may be determined for each surfactant liquid 60. Alternatively, the contact angle θR-SIM may be determined by a reference document (e.g., a database) from prior testing using surfactant liquid 60 and surfactant solution 74. In a step 306, the contact angle $\theta_{D\text{-}SIM}$ in the simulated surfactant depleted region $SDR_{SIM}$ on testing substrate 72a rinsed in solvent 78 may be determined for each surfactant liquid 60. Alternatively, the contact angle $\theta_{D\text{-}SIM}$ may be determined by a reference document (e.g., database) from prior testing using surfactant liquid 60 and solvent 78. In a step 308, surfactant liquid 60 suitable for imprinting may be determined. For example, surfactant liquid 60 that provides $\theta_{SRR} > \theta_{SDR}$ may be selected. In a step 310, imprint material 58 formed of polymerizable material 34 and surfactant liquid 60 may be deposited on substrate 12. It should be noted that surfactant liquid 60 may be applied directly to template 18 and need not be directly added to polymerizable material 34 prior to contact of template 18 with polymerizable material 34. Generally, surfactant liquid 60 in imprint fluid 58 may migrate towards the gas/liquid interface. In a step 312, template 18 may contact imprint fluid 58 providing at least a portion of surfactant liquid 60 on surface 62 of template 18 to form at least one surfactant rich region SRR and at least one surfactant depleted region SDR. The approximate contact angle $\theta_{SRR}$ provided within at least one surfactant rich region SRR during imprinting may be less than, greater than, or substantially similar to the approximate contact angle $\theta_{SDR}$ within at least one surfactant depleted region SDR during imprinting. In a step 314, polymerizable material 34 may be solidified to provide patterned layer 46.

Drop Pattern Shifting Applications Using Contact Angle Analysis

Figure 7A:
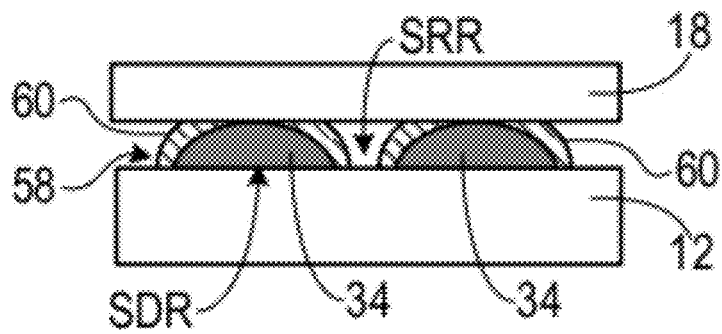
FIGS. 7A-7B illustrate a simplified side view and a top down view, respectively, of surfactant depleted regions SDR and surfactant rich regions SRR after imprinting using a first drop pattern.
Figure 7B:
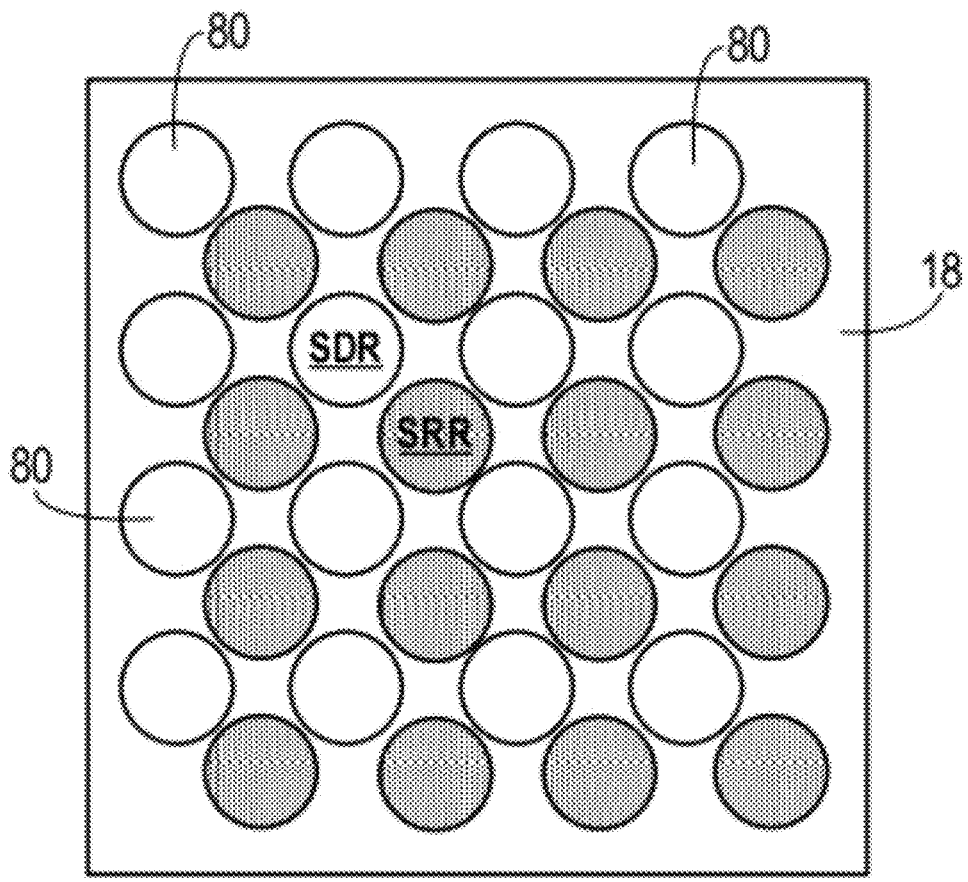

As illustrated in FIGS. 3A-3C, distribution of surfactant on template 18 may provide two regions: the surfactant rich region SRR and the surfactant depleted region SDR. During this stage, the surfactant rich region SRR on template 18 is generally located at the point of contact between template 18 and imprint fluid 58. During filling of the desired volume between mold 20 and substrate 12, as illustrated in FIGS. 7A and 7B, surfactant liquid 60 within imprint fluid 58 may migrate to the gas/liquid interface as template 18 contacts imprint fluid 58 and imprint fluid 58 spreads on surface 44 of substrate 12. As such, surfactant liquid 60 may build up in localized regions on template 18 forming surfactant depleted regions SDR at drop locations 80 and surfactant rich regions SRR between drop locations 80. The surfactant rich regions SRR between drop locations 80 generally form interstitial areas where voids may occur.

Drop shifting may even out surfactant distribution on template 18. For example, FIG. 7B illustrates surfactant depleted regions SDR and surfactant rich regions SRR after a first drop pattern imprint. In a subsequent imprint, a second drop pattern may be used that provides drop locations 80 at a shifted location as compared to the first drop pattern. The shifted location of drops 80 in the subsequent drop pattern may be positioned such that at least one of drops 80 of imprint fluid 58 contacts template 18 at a surfactant rich region SRR.

During imprinting of multiple substrates 12, drop shift patterning may be used successively or sporadically. For example, a first drop pattern may be used to imprint followed by one or more drop shifted patterns. Alternatively, a first drop pattern may be used multiple times prior to one or more drop shifted patterns being used. In a similar fashion, a first drop pattern may be used once followed by multiple uses of one or more drop shifted patterns.

Further, by reducing the contact angle $\theta_{SDR}$ of the surfactant depleted region SDR as compared to the contact angle $\theta_{SRR}$ of the surfactant rich region SRR such that $\theta_{SRR} > \theta_{SDR}$, the lower contact angle $\theta_{SDR}$ of the surfactant depleted region SDR may provide additional driving force for polymerizable material 34 to wet and fill the surfactant depleted region SDR.

Figure 8:
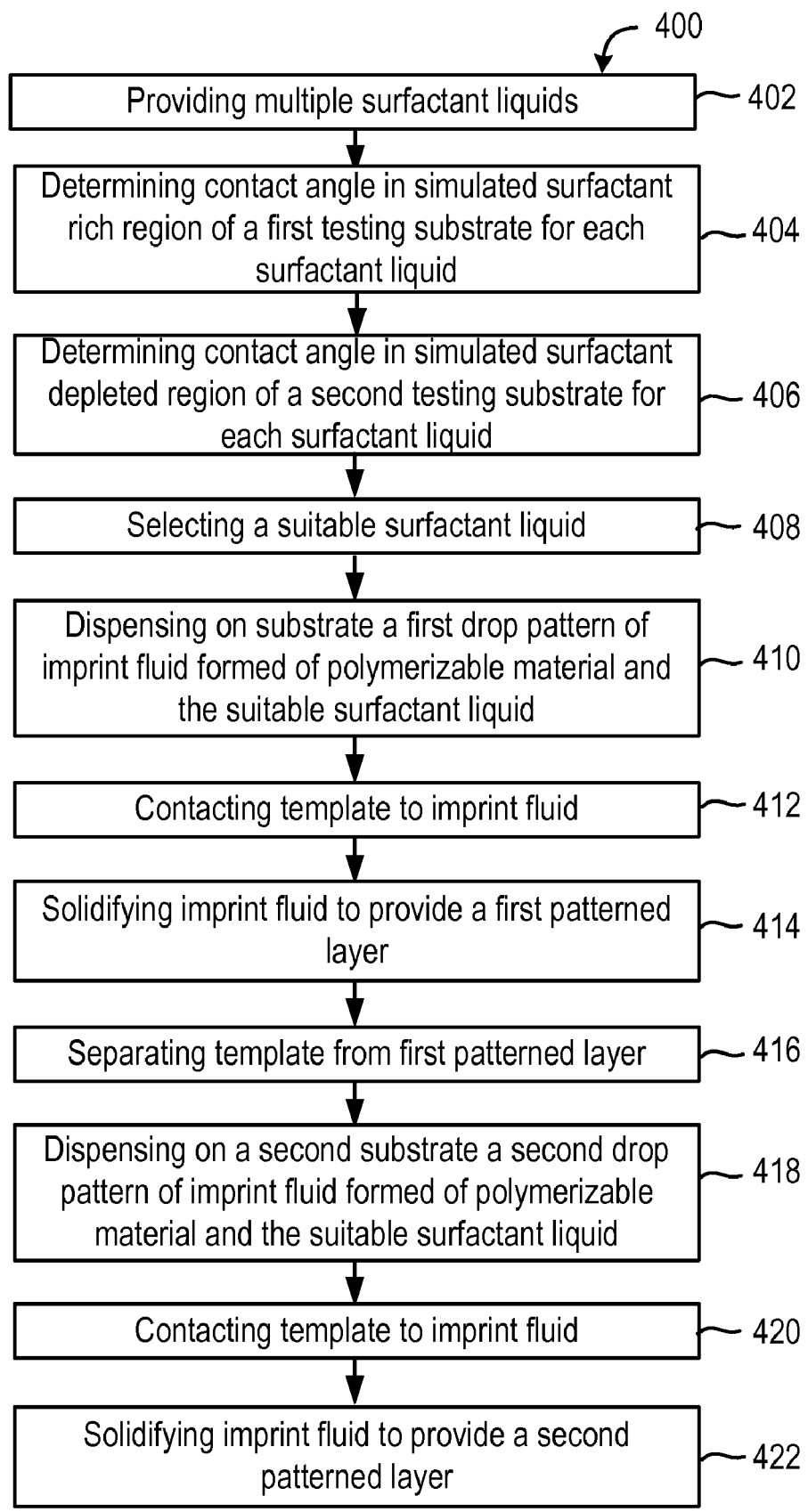
FIG. 8 illustrates a flow chart of another exemplary method for providing suitable wetting characteristics between a template and a polymerizable material.

FIG. 8 illustrates a flow chart of another exemplary method 400 for providing suitable wetting characteristics between a template and a polymerizable material using drop pattern shifting. In a step 402, multiple surfactant solutions 74 and/or multiple surfactant liquids 60 may be provided. In a step 404, the contact angle $\theta_{R\text{-}SIM}$ in the simulated surfactant rich regions $SRR_{SIM}$ on testing substrate 72 rinsed with surfactant solution 74 may be determined for each surfactant liquid 60. In a step 406, the contact angle $\theta_{D\text{-}SIM}$ in the simulated surfactant depleted region $SDR_{SIM}$ on testing substrate 72a rinsed in solvent 78 may be determined for each surfactant liquid 60. In a step 408, surfactant liquid 60 that provides a suitable contact angle may be selected. For example, surfactant liquid 60 that provides contact angles $\theta_{SRR} > \theta_{SDR}$ may be selected.

In a step 410, imprint material 58 formed of polymerizable material 34 and surfactant liquid 60 may be dispensed on substrate 12 in a first pattern. Generally, surfactant liquid 60 in imprint fluid 58 may migrate towards the gas/liquid interface. In a step 412, template 18 may contact imprint fluid 58. In a step 414, imprint fluid 58 may be solidified to provide first patterned layer 46. In a step 416, template 18 may be separated from first patterned layer 46 with template 18 having the surfactant rich regions SRR and the surfactant depleted regions SDR upon removal.

In a step 418, imprint material 58 formed of polymerizable material 34 and surfactant liquid 60 may be dispensed in a second drop pattern on second substrate 12. The second drop pattern may be substantially similar to the first drop pattern and shifted a position x and/or a position y such that at least one drop location contacts at least one surfactant depleted region SDR of template 18. In a step 420, template 18 may contact imprint fluid 58. In a step 422, imprint fluid 58 may be solidified to provide second patterned layer 46. The second patterned layer 46 may have limited or no voids.

What is claimed is:

1. An imprint lithography method comprising:
dispensing on a substrate a first imprint fluid comprising a first polymerizable material and a surfactant;
contacting a surface of an imprint lithography template, in superimposition with the substrate, with the first imprint fluid such that at least a portion of the surfactant of the first imprint fluid contacts the surface of the imprint lithography template;
solidifying the first imprint fluid;
separating the surface of the imprint lithography template and the solidified first imprint fluid to form on the surface of the imprint lithography template a surfactant rich region having a first thickness and a surfactant depleted region having a second thickness; and
contacting the surface of the imprint lithography template having the surfactant rich region and the surfactant depleted region with a second imprint fluid such that at least a portion of the second imprint fluid contacts the surface of the imprint lithography imprint lithography template having the surfactant rich region and the surfactant depleted region, wherein a first contact angle between the imprint lithography template and the second imprint fluid within the surfactant rich region of the imprint lithography template is greater than a second contact angle between the imprint lithography template and the second imprint fluid within the surfactant depleted region of the imprint lithography template.

2. The method of claim 1, wherein the first thickness is greater than the second thickness.

3. The method of claim 1, wherein the second thickness is substantially zero.

4. The method of claim 1, wherein a magnitude of the first contact angle is less than 50 degrees.

5. The method of claim 1, further comprising solidifying the second imprint fluid after the second imprint fluid is contacted with the surface of the imprint lithography template.

6. The method of claim 1, wherein the surface of the imprint lithography template comprises a plurality of spaced-apart recesses or protrusions.

7. The method of claim 1, wherein a magnitude of the second contact angle is less than approximately 22 degrees.

8. The method of claim 7, wherein a magnitude of the second contact angle is less than approximately 18 degrees.

9. The method of claim 1 wherein the first thickness is between approximately 0.2 nm and approximately 5 nm.

10. The method of claim 1, wherein:
before contacting the surface of the imprint lithography template with the first imprint fluid, the surface of the imprint lithography template is substantially free of surfactant, and
during contacting the surface of the imprint lithography template with the first imprint fluid, the portion of the surfactant of the first imprint fluid in contact with the surface of the imprint lithography template defines an initial surfactant rich region on the surface of the imprint lithography template and an initial surfactant depleted region on the surface of the imprint lithography template adjacent the initial surfactant rich region on the surface of the imprint lithography template,
wherein a third contact angle between the surface of the imprint lithography template and the first imprint fluid within the initial surfactant rich region of the imprint lithography template is greater than a fourth contact angle between the surface of the imprint lithography template and the first imprint fluid within the initial surfactant depleted region of the imprint lithography template.

11. An imprint lithography method comprising:
dispensing on a substrate a first imprint fluid comprising a first polymerizable material and a surfactant;
contacting a surface of an imprint lithography template, in superimposition with the substrate, with the first imprint fluid such that at least a portion of the surfactant of the first imprint fluid contacts the surface of the imprint lithography template;
solidifying the first imprint fluid;
separating the surface of the imprint lithography template and the solidified first imprint fluid to form on the surface of the imprint lithography template a surfactant rich region having a first thickness and a surfactant depleted region having a second thickness; and
contacting the surface of the imprint lithography template having the surfactant rich region and the surfactant depleted region with a second imprint fluid, such that at least a portion of the second imprint fluid contacts the surface of the imprint lithography template having the surfactant rich region and the surfactant depleted region,
wherein a magnitude of the difference between a first contact angle between the imprint lithography template and the second imprint fluid within the surfactant rich region of the imprint lithography template and a second contact angle between the imprint lithography template and the second imprint fluid within the surfactant depleted region of the imprint lithography template is about 2 degrees.

12. The method of claim 11, wherein the first thickness is greater than the second thickness.

13. The method of claim 11, wherein the second thickness is substantially zero.

14. The method of claim 11, wherein a magnitude of the first contact angle is less than 50 degrees.

15. The method of claim 11, further comprising solidifying the second imprint fluid after the second imprint fluid is contacted with the imprint lithography template.

16. The method of claim 11, wherein the surface of the imprint lithography template comprises a plurality of spaced-apart recesses or protrusions.

17. The method of claim 11 wherein the first thickness is between approximately 0.2 nm and approximately 5 nm.

18. The method of claim 11, wherein:
before contacting the surface of the imprint lithography template with the first imprint fluid, the surface of the imprint lithography template is substantially free of surfactant, and
during contacting the surface of the imprint lithography template with the first imprint fluid, the portion of the surfactant of the first imprint fluid in contact with the surface of the imprint lithography template defines an initial surfactant rich region on the surface of the imprint lithography template and an initial surfactant depleted region on the surface of the imprint lithography template adjacent the initial surfactant rich region on the surface of the imprint lithography template,
wherein a third contact angle between the surface of the imprint lithography template and the first imprint fluid within the initial surfactant rich region of the imprint lithography template is greater than a fourth contact angle between the surface of the imprint lithography template and the first imprint fluid within the initial surfactant depleted region of the imprint lithography template.

* * * * *